United States Patent
Kim et al.

(10) Patent No.: US 7,601,246 B2
(45) Date of Patent: Oct. 13, 2009

(54) METHODS OF SPUTTERING A PROTECTIVE COATING ON A SEMICONDUCTOR SUBSTRATE

(75) Inventors: Jisoo Kim, Pleasanton, CA (US); Jong Shon, Fremont, CA (US); Biming Yen, Fremont, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 818 days.

(21) Appl. No.: 10/952,088

(22) Filed: Sep. 29, 2004

(65) Prior Publication Data

US 2009/0020417 A1 Jan. 22, 2009

(51) Int. Cl.
*C23C 14/34* (2006.01)
(52) U.S. Cl. ............... 204/192.23; 204/192.12; 204/192.15; 204/192.32; 204/298.12; 204/298.07
(58) Field of Classification Search ............ 204/192.23, 204/192.25
See application file for complete search history.

(56) References Cited

U.S. PATENT DOCUMENTS

| | | | | |
|---|---|---|---|---|
| 3,829,373 A | * | 8/1974 | Kuehnle ............... 204/298.24 |
| 4,022,939 A | * | 5/1977 | Roth et al. ............... 427/251 |
| 4,251,289 A | * | 2/1981 | Moustakas et al. ........... 136/255 |
| 4,896,813 A | * | 1/1990 | Saijo et al. ............... 228/116 |
| 5,545,512 A | * | 8/1996 | Nakato ............... 430/323 |
| 5,798,029 A | * | 8/1998 | Morita ............... 204/298.16 |
| 6,083,361 A | * | 7/2000 | Kobayashi et al. ...... 204/192.15 |
| 6,242,344 B1 | | 6/2001 | Koh et al. |
| 6,331,380 B1 | * | 12/2001 | Ye et al. ............... 430/318 |
| 6,391,787 B1 | * | 5/2002 | Dhindsa et al. ............. 438/710 |
| 6,579,791 B1 | | 6/2003 | Tu et al. |
| 6,589,711 B1 | | 7/2003 | Subramanian et al. |
| 6,613,666 B2 | * | 9/2003 | Ma ............... 438/637 |
| 6,720,256 B1 | | 4/2004 | Wu et al. |
| 6,919,101 B2 | * | 7/2005 | Zhang et al. ............ 427/255.29 |
| 2003/0127319 A1 | * | 7/2003 | Demaray et al. ........ 204/192.26 |
| 2003/0216036 A1 | | 11/2003 | Ma |

OTHER PUBLICATIONS

Seshan, K. (2002). Handbook of Thin-Film Deposition Processes and Techniques—Principles, Methods, Equipment and Applications (2nd Edition). William Andrew Publishing/Noyes.*
"Photoresists for 193-nm lithography" Allen et al. IBM Journal of Research & Development; Jan.-Mar. 1997, vol. 41 Issue 1/2, p. 95.*
Australian Examination Report dated Feb. 22, 2007 for SG 200506288-0.

* cited by examiner

*Primary Examiner*—Nam X Nguyen
*Assistant Examiner*—Jason M Berman
(74) *Attorney, Agent, or Firm*—Buchanan Ingersoll & Rooney PC

(57) ABSTRACT

Methods of depositing a protective coating of a silicon-containing or metallic material onto a semiconductor substrate include sputtering such material from an electrode onto a semiconductor substrate in a plasma processing chamber. The protective material can be deposited onto a multi-layer mask overlying a low-k material and/or onto the low-k material. The methods can be used in dual damascene processes to protect the mask and enhance etch selectivity, to protect the low-k material from carbon depletion during resist strip processes, and/or protect the low-k material from absorption of moisture.

29 Claims, 4 Drawing Sheets

US 7,601,246 B2

METHODS OF SPUTTERING A PROTECTIVE COATING ON A SEMICONDUCTOR SUBSTRATE

BACKGROUND

Semiconductor devices are made from multi-layer structures that are fabricated on semiconductor wafers. The multi-layer structures can include dielectric materials between metallization interconnect lines. In very large scale integration (VLSI) and ultra large scale integration (ULSI) circuits, metal interconnect lines and vias provide interconnection of integrated circuits in semiconductor devices. In a dual damascene process, a dielectric layer is patterned with openings for conductive lines and vias. The openings are filled with metal and provide interconnects for integrated circuits. The dual damascene process is also used to form multilevel conductive lines of metal in insulating layers of multilayer substrates on which semiconductor devices are mounted.

As the demand for faster device speeds continues to increase, dielectric materials with lower dielectric constants, i.e., "low-k" dielectrics, are being used. The speed of an interconnect structure can be characterized in terms of RC (resistance/capacitance) delays. Low-k materials reduce inter-metal capacitance and therefore can reduce delays and provide for faster devices.

SUMMARY

Methods of depositing a protective coating on a semiconductor substrate in a dual damascene process are provided. The methods are performed in a capacitively-coupled plasma processing chamber of a semiconductor processing apparatus. The plasma processing chamber includes an electrode made of a material that is sputtered so as to form a protective coating on a semiconductor substrate in the plasma processing chamber.

A method of depositing a protective coating according to a first preferred embodiment comprises providing a semiconductor substrate comprising a low-k dielectric layer and a mask that includes a patterned top imaging layer over the low-k dielectric layer in a plasma processing chamber. A plasma is produced in the plasma processing chamber. Depending on the composition of the electrode, the plasma sputters silicon-containing material or metallic material from the electrode so as to form a protective coating of the sputtered material on the imaging layer, preferably without substantially etching the semiconductor substrate.

A method of depositing a protective coating according to a second preferred embodiment comprises providing a semiconductor substrate comprising a patterned low-k dielectric layer and an overlying mask in a plasma processing chamber. A plasma is produced in the plasma processing chamber and the plasma sputters silicon-containing material or metallic material from the electrode so as to form a protective coating of the sputtered material on sidewalls of the low-k dielectric layer, preferably without substantially etching the semiconductor substrate. The protective coating can protect the sidewalls of the low-k dielectric layer when the mask is stripped from the semiconductor substrate.

A method of depositing a protective coating according to a third preferred embodiment comprises providing a semiconductor substrate comprising a patterned low-k dielectric layer in a plasma processing chamber. A plasma is produced in the plasma processing chamber and the plasma sputters a silicon-containing material or a metallic material from the first electrode so as to form a protective coating of the sputtered material on the low-k dielectric layer, preferably without substantially etching the semiconductor substrate.

A method of depositing a protective coating according to a fourth preferred embodiment comprises providing a semiconductor substrate, which comprises a low-k dielectric material layer and an optional mask including a patterned top imaging layer over the low-k dielectric layer, in a plasma processing chamber. A plasma is produced in the plasma processing chamber and the plasma sputters a silicon-containing material or a metallic material from the first electrode so as to form a protective coating of the sputtered material on (i) the low-k dielectric material or (ii) the optional imaging layer, preferably without substantially etching the semiconductor substrate.

BRIEF DESCRIPTION OF THE DRAWING FIGURES

DETAILED DESCRIPTION OF PREFERRED EMBODIMENTS

Figure 1:
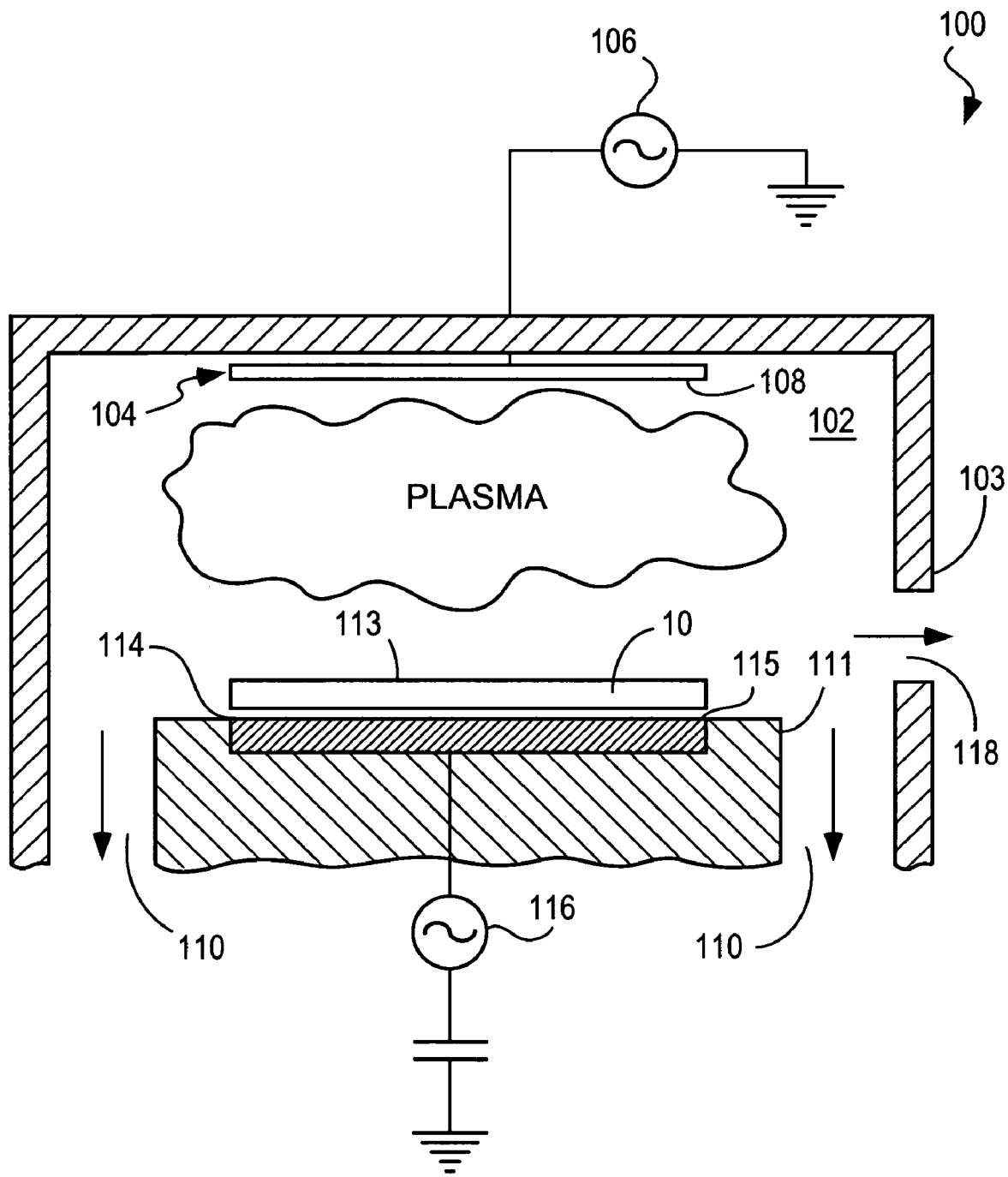
FIG. 1 illustrates an exemplary embodiment of a capacitively-coupled plasma processing chamber that can be used for practicing embodiments of the methods of depositing a protective coating on a semiconductor substrate.

Semiconductor device performance has been improved by reducing device dimensions. The minimum critical dimension, R, that can be resolved is given by the equation: $R=k\lambda/NA$, where k is a process constant, $\lambda$ is the exposure wavelength, and NA is the numerical aperture of the exposure tool. To achieve finer resolution in patterns and smaller device dimensions, a shorter exposure wavelength $\lambda$ is used for photolithography. Different photoresist materials have been formulated for the different exposure wavelengths.

Thinner photoresist films can contribute to reducing k, and thereby reducing R. However, thinner photoresist films present difficulties with respect to planarization and film thickness non-uniformity, for example.

In dual damascene processing, a multi-layer resist structure can be used to pattern features in an underlying low-k material. The multi-layer resist structure can include, for example, a top imaging layer and one or more underlying mask layers. The imaging layer is exposed to light and exposed portions of the imaging layer are developed and then removed to pattern the imaging layer.

In a multi-layer photoresist structure, there is preferably a high etch selectivity of the top imaging layer with respect to the underlying mask layers(s) so that the pattern in the imaging layer can be transferred to the underlying layer(s) during etching. The thicker underlying mask layer is stronger and more resistant than the imaging layer and may be non-photosensitive.

The etch selectivity of the imaging layer with respect to the underlying mask layer(s) can be increased by different approaches. For example, the imaging layer in a multi-layer stack can contain a small percentage of silicon to form an etch-resistant oxide in an oxygen plasma. However, increasing the silicon content of the imaging layer to enhance its etch selectivity can degrade imaging performance.

Another approach for increasing the etch selectivity of the imaging layer with respect to underlying mask layer(s) is to deposit a fluorocarbon or hydrofluorocarbon polymer material to protect the mask layer. However, during plasma etching and/or stripping processes, the polymer can react with underlying films and cause etching of the side wall of the pattern. In addition, the polymer can deposit on exposed surfaces of the plasma processing chamber. Such polymer deposits can contaminate and/or undesirably alter dry etching processes performed in the plasma processing chamber.

It has also been determined that during stripping processes to remove photoresist from an underlying low-k dielectric material in a dual damascene process after the low-k dielectric material has been etched using the patterned photoresist, plasma generated from strip process gases, such as oxygen-containing etching gas mixtures, can etch sidewalls of the low-k dielectric material and deplete the carbon level in the etched sidewall regions. As a result, the k-value of the dielectric material is changed in the carbon-depleted regions.

It has also been determined that, after photoresist has been stripped from underlying low-k dielectric material, the low-k dielectric material can absorb moisture and be adversely affected by aging.

In light of the desirability to have a high etch selectivity of the imaging layer with respect to underlying mask layer(s) in a multi-layer photoresist structure, as well as to preferably protect underlying low-k material from carbon depletion during resist stripping processes and moisture (water) absorption following stripping processes, methods of depositing a protective coating on a multi-layer photoresist and on a low-k dielectric material are provided. The protective coating has a composition and a thickness effective to protect the material that it covers with respect to plasma etching.

A method according to a first preferred embodiment comprises forming a protective coating of silicon-containing material or metallic material on a patterned imaging layer of a multi-layer photoresist stack in a plasma processing chamber. The protective coating preferably increases the etch selectivity of the imaging layer with respect to other layers of the stack.

A method according to a second preferred embodiment comprises forming a protective coating of silicon-containing material or metallic material on sidewalls of a patterned low-k dielectric material in a plasma processing chamber. The protective coating preferably reduces, and more preferably minimizes, damage to the low-k dielectric material during stripping of an overlying mask from the semiconductor substrate.

A method according to a third preferred embodiment comprises forming a protective coating of silicon-containing material or metallic material on a low-k dielectric material after stripping of a mask from the semiconductor substrate. The protective coating preferably reduces, and more preferably minimizes, moisture absorption by the low-k dielectric material when the dielectric material is exposed to a moisture-containing atmosphere. As a result, the protective coating can preferably minimize aging of the low-k dielectric material.

In another preferred embodiment, two or all three of the first, second and third preferred embodiments can be performed during a dual damascene process to form a protective coating on the photoresist and low-k dielectric material during plasma processing.

Preferred embodiments of the methods of forming a protective coating of silicon-containing material or metallic material on a multi-layer mask and/or on a low-k dielectric material comprise sputtering silicon-containing material or metallic material from an electrode and onto a photoresist and/or low-k dielectric material of a semiconductor substrate. The methods are performed in a dual damascene process in a capacitively-coupled plasma processing apparatus. The sputtering is preferably achieved without substantial, more preferably without any, etching of the semiconductor substrate.

FIG. 1 illustrates an exemplary plasma processing apparatus 100 that can be used to practice preferred embodiments of the methods of depositing a protective coating of silicon-containing material or metallic material onto a semiconductor substrate. The plasma processing apparatus 100 comprises a capacitively-coupled plasma processing chamber 102, which can generate a medium-density plasma. The plasma processing chamber 102 includes a chamber wall 103. To provide an electrical path to ground, the chamber wall 103 can be made of aluminum or the like and electrically grounded. The plasma processing chamber 102 includes a wafer transfer slot 118 provided in the chamber wall 103 to transfer semiconductor substrates into and out of the plasma processing chamber 102.

The plasma processing chamber 102 includes an upper electrode 104 having a bottom surface 108. The upper electrode 104 can be a showerhead electrode including gas passages for distributing process gas into the plasma processing chamber. In such embodiments, the apparatus 100 includes a gas source (not shown) for supplying process gas to the upper electrode 104. The upper electrode 104 is preferably powered by an RF power source 106 via a matching network. In another embodiment, the upper electrode 104 can be grounded to provide a return path for power supplied by a bottom electrode of the plasma processing chamber 102, as described below.

In the embodiment of the apparatus 100 shown in FIG. 1, process gas is supplied into the plasma processing chamber 102 at the RF-induced plasma region between the upper electrode 104 and a semiconductor substrate 10, e.g., a semiconductor wafer, supported on a substrate support 111. The substrate support 111 preferably includes an electrostatic chuck 114 that secures the semiconductor substrate 10 on the substrate support by an electrostatic clamping force. The electrostatic chuck 114 acts as a bottom electrode and is preferably biased by an RF power source 116 (typically via a matching network). The upper surface 115 of the electrostatic chuck 114 preferably has approximately the same diameter as the semiconductor substrate 10.

A pump (not shown) is adapted to maintain a desired vacuum pressure inside the plasma processing chamber 102. Gas is drawn by the pump generally in the direction represented by arrows 110.

Figure 2A:
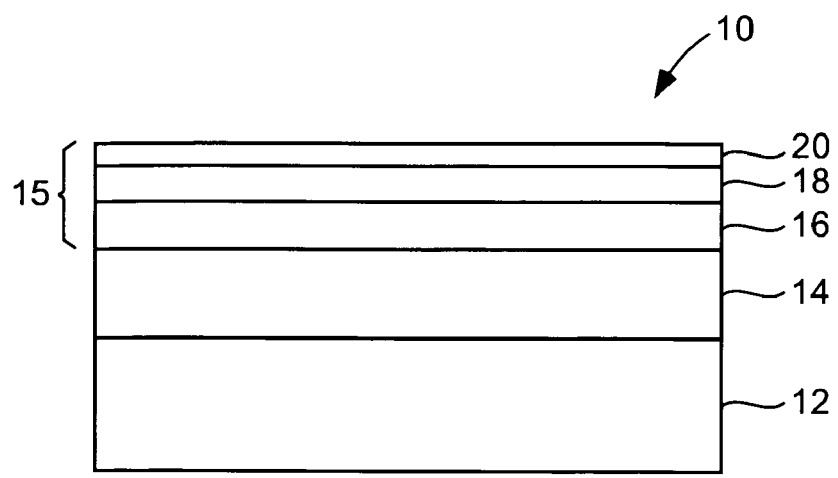
FIGS. 2A-2C illustrate a first embodiment of a method of depositing a protective coating on an imaging layer of a mask of a semiconductor substrate.

FIG. 2A depicts an exemplary semiconductor substrate 10 that can be processed by preferred embodiments of the methods of depositing a protective coating of silicon-containing material or metallic material. The semiconductor substrate 10 includes a base material 12, a low-k dielectric layer 14 on the base material 12, and a multi-layer mask 15 on the low-k dielectric layer 14. The semiconductor substrate 10 can optionally include one or more additional layers, such as a cap layer between the low-k dielectric layer 14 and the mask 15, and/or one or more layers between the low-k dielectric layer 14 and the base material 12, such as a barrier or stop layer of SiC, SiN or TEOS/SiC.

The base material 12 can be, for example, a single crystal silicon wafer.

The low-k dielectric layer 14 can be of any suitable organic or inorganic low-k dielectric material. Exemplary low-k dielectric materials that can be used to form the low-k dielectric layer 14 include CORAL® (carbon-doped oxide with a dielectric constant ranging from 3.3 to less than 2.5), which is available from Novellus Systems, Inc; BLACK DIAMOND® (carbon-doped silicon-oxide based chemical vapor deposition film with a dielectric constant of 3.0 or less), which is available from Applied Materials, Inc.; SILK® (semiconductor dielectric resin with a dielectric constant less than 3.0), which is available from The Dow Chemical Company; AURORA® (a low-k dielectric carbon-doped oxide), which is available from ASM International; porous materials including, for example aerogel and Xerogel; nanoglass, and the like. The low-k dielectric material preferably has a k value of about 3.5 or less, more preferably about 3 or less.

The mask 15 can include various multiple-layer stacks. The embodiment of the mask shown in FIG. 2A includes a top imaging layer 20, an intermediate layer 18, which is preferably of an antireflective coating (BARC), and a bottom layer 16. These layers can have any suitable composition and thickness. For example, the imaging layer 20 can have a composition suitable for 193 nm (i.e., ArF laser light) exposing radiation, and the bottom layer 16 can be a photoresist having a composition suitable for 248 nm (i.e., KrF laser light) or 365 nm (i.e., i-line) exposing radiation. The imaging layer 20 can have a thickness of up to about 100 nm, for example. The bottom layer 16 can have a thickness of up to about 200 nm, for example. Other exemplary stacks of layers that can be used for the mask 15 are the following: ArF imaging layer/thin oxide/KrF photoresist, ArF imaging layer/amorphous carbon, ArF imaging layer/thin oxide/amorphous carbon, and ArF imaging layer/i-line photoresist.

Figure 2B:
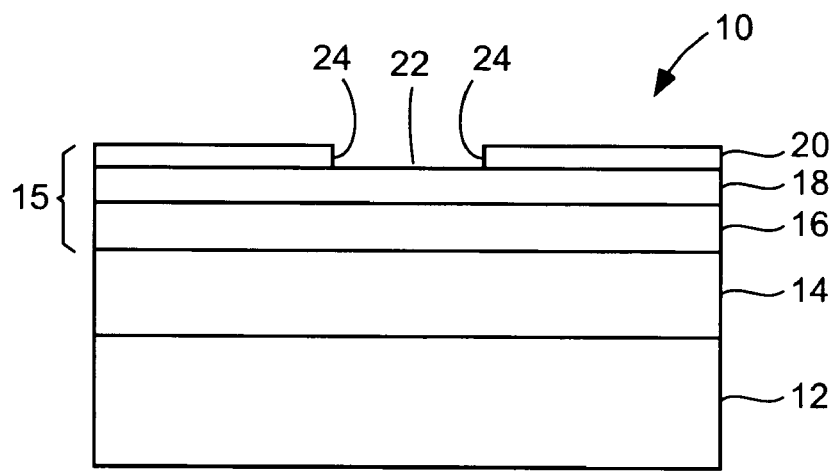

FIG. 2B shows the imaging layer 20 after it has been patterned to include openings 22 defined by sidewalls 24 (only one opening 22 is shown). The patterned imaging layer 20 is used as a mask for etching through the intermediate layer 18 and bottom layer 16 of the multi-layer mask 15.

Figure 2C:
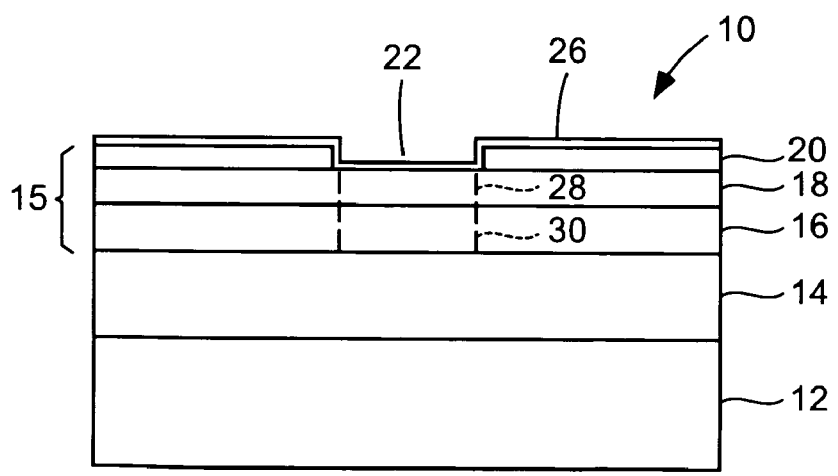

As shown in FIG. 2C, a method according to a first preferred embodiment comprises depositing a protective coating 26 of a silicon-containing material or a metallic material on the patterned imaging layer 20. The protective coating 26 preferably is effective to increase the etch selectivity of the imaging layer 20 with respect to the underlying material of the mask 15. As a result, the pattern of openings 22 formed in the imaging layer 20 is preferably retained during plasma etching of openings 28 through the intermediate layer 18 and bottom layer 16, and during plasma etching of openings 30 through the low-k dielectric layer 14.

In the embodiment, the protective coating 26 of silicon-containing material or metallic material is sputtered onto the imaging layer 20 from an upper electrode of a capacitively-coupled plasma processing chamber, such as the upper electrode 104 of the plasma processing chamber 102 shown in FIG. 1. The composition of the sputtered protective coating 26 is determined by the composition of the upper electrode 104. For example, the upper electrode 104 can be composed of un-doped silicon (e.g., single crystal silicon), doped silicon (e.g., boron- or phosphorous-doped silicon), or silicon carbide. In other embodiments, the upper electrode 104 can be composed of a metallic material, such as TiN, TaN or the like. Typically, the protective coating 26 can have a thickness of at least about 50 nm, such as up to about 200 nm, to provide protection to the surface(s) covered by the coating.

For an embodiment referred to herein as a "bottom feed" embodiment, power is applied to the lower electrode (e.g., electrostatic chuck 114) preferably at both a first low frequency and a second high frequency, while the upper electrode 104 is preferably grounded or provides a return path for the lower electrode. A power level of up to about 1000 W, more preferably up to about 500 W, is applied to the electrostatic chuck 114 at two different frequencies including a first low frequency of less than about 10 MHz, more preferably less than about 5 MHz, and a second high frequency of more than about 12 MHz, more preferably more than about 20 MHz. By powering the electrostatic chuck 114 at these power and frequency conditions, a higher potential is created at the upper electrode 104 than at the electrostatic chuck 114. As a result, silicon-containing material or metallic material is sputtered from the upper electrode 104, while the semiconductor substrate 10 preferably is not substantially etched, and more preferably is not etched at all, by the plasma.

In an embodiment referred to herein as a "top feed" embodiment, at least about 100 W power can be applied to the upper electrode 104 at a selected frequency while power is applied to the ESC 114 at a different frequency. The frequency range for the applied power to the upper electrode 104 is not particularly limited.

Details of dual-frequency plasma reactors are described in commonly-assigned U.S. Pat. No. 6,391,787, which is incorporated herein by reference in its entirety.

As shown in FIG. 1, the bottom surface 108 of the upper electrode 104 faces the upper surface 113 of the semiconductor substrate 10 supported on the upper surface 115 of the electrostatic chuck 114. As shown, the semiconductor substrate 10 can typically have a diameter (e.g., 200 mm or 300 mm) which substantially corresponds to the diameter of the upper surface 115 of the electrostatic chuck 114.

For the bottom feed embodiment where power at two different frequencies is applied to the electrostatic chuck 114 while the upper electrode 104 is grounded or provides a return path for the lower electrode, the ratio of the area of the electrical ground surface to the area of the upper surface 113 of the semiconductor substrate 10 (or the upper surface 115 of the electrostatic chuck 114 when it has an area substantially equal to the area of the upper surface 113 of the semiconductor substrate 10) is preferably less than about 5. The electrical ground surface is (i) the bottom surface 108 of the upper electrode 104 when plasma is confined between the upper electrode 104 and the lower electrode, or (ii) the bottom surface 108 of the upper electrode 104 and also the area of the surface of the chamber wall 103 when plasma extends to the chamber wall 103. For example, the bottom surface 108 of the upper electrode 104 preferably has an area that is up to five times larger than the area of the upper surface 113 of the semiconductor substrate 12 when plasma is confined between the upper electrode 104 and lower electrode.

For the top feed embodiment where the upper electrode 104 is powered, the ratio of the electrical ground area (i.e., the area of the chamber wall 103) to the area of the bottom surface 108 of the upper electrode 104 is preferably less than about 5.

By using the above-described area ratios in the top feed and bottom feed embodiments, sputtering of silicon-containing or metallic material from the upper electrode 104 can be achieved without substantially etching, or more preferably without etching at all, the semiconductor substrate 12.

The process gas used to produce a plasma for sputtering the silicon-containing or metallic material from the upper electrode 104 preferably comprises a mixture of $H_2$ and an inert gas. The inert gas can be one or more of Ar, He, Ne, Xe or the like. The flow rates of each of $H_2$ and the inert gas are dependent on factors, such as the size of the chamber and the diameter of the semiconductor substrate, and preferably range from about 50 sccm to about 1000 sccm. Preferably, the flow rate of $H_2$ is no greater than, and more preferably is less than, the flow rate of the inert gas, such as an $H_2$:inert gas ratio of from about 0.5:1 to less than 1:1. Otherwise, sputtering of the protective coating material, e.g., silicon, from the upper electrode 104 may not occur. During the sputtering process, the plasma processing chamber preferably is at a pressure of about 10 mT to about 300 mT. Exemplary process conditions for sputtering a protective material, e.g., silicon from a silicon upper electrode according to the bottom feed embodiment are as follows: chamber pressure of about 200 mT/about 2 MHz to about 12 MHz low-frequency power/about 12 MHz to about 27 MHz high-frequency power/about 200 W applied to bottom electrode/about 150 to about 300 sccm $H_2$/about 300 sccm argon.

After the protective coating 26 of silicon-containing material or metallic material has been deposited on the imaging layer 20 as shown in FIG. 2C, openings 28 can be etched through the intermediate layer 18 and bottom layer 16 using a plasma generated from an oxygen-containing plasma, such as an $O_2/N_2$, $O_2/H_2O$, $O_2/N_2/CF_4$, or $O_2/N_2/H_2O$ gas mixture. During etching of the openings 28 using such gas mixtures, a protective coating 26 of Si can be converted to $SiO_2$, which can provide a higher etch rate selectivity with respect to the intermediate layer 18 and bottom layer 16.

The openings 30 through the low-k dielectric layer 14 (and optional cap layer) can be etched using a plasma generated from any suitable etching gas mixture, such as gas mixtures containing fluorocarbons (represented by $C_xF_y$, where x>0 and y>0) and hydrofluorocarbons (represented by $C_xH_yF_z$, where x>0, y>0 and z>0), e.g., $CF_4$, $CHF_3$, $C_4F_6$ and $C_4F_8$, and other gases including inert carrier gases.

Figure 3A:
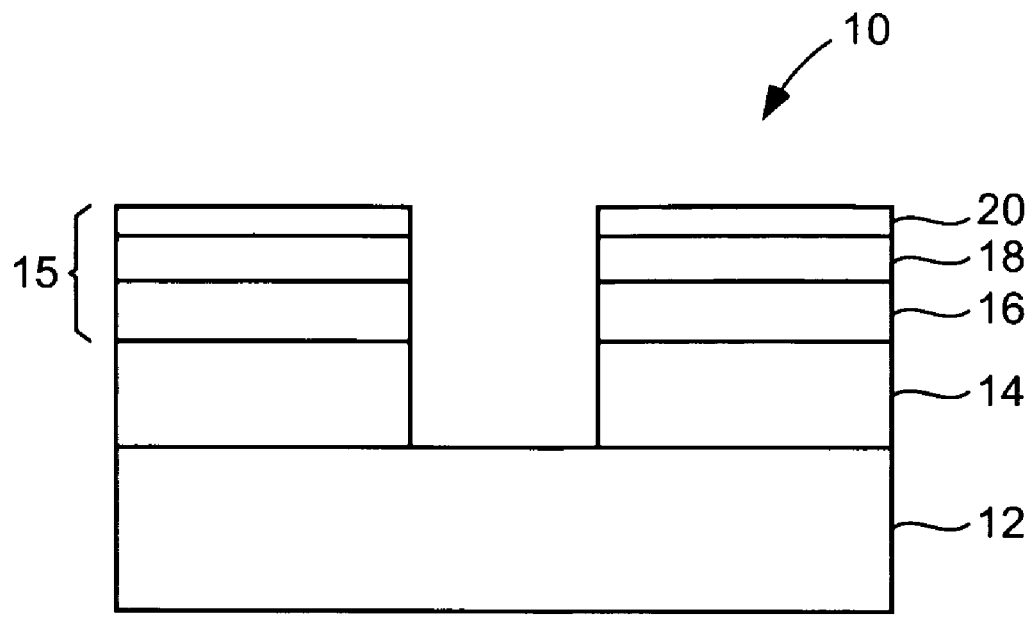
FIGS. 3A-3B illustrate a second embodiment of a method of depositing a protective coating on sidewalls of a low-k dielectric layer of a semiconductor substrate prior to the stripping of an overlying mask.
Figure 3B:
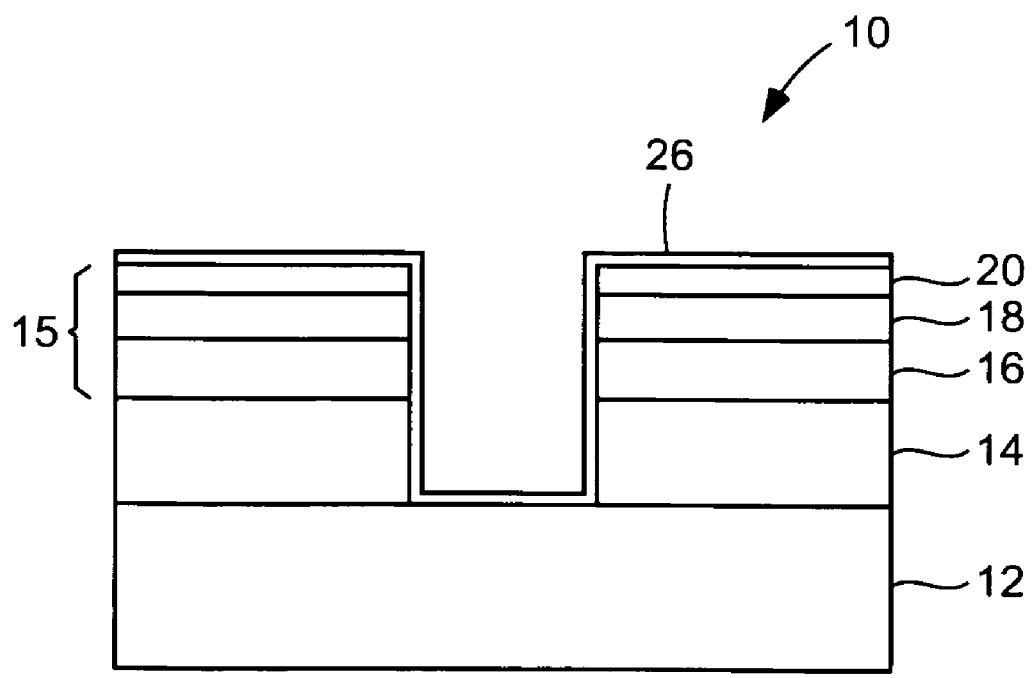

A process according to a second preferred embodiment is illustrated in FIGS. 3A and 3B. FIG. 3A shows semiconductor substrate 10 after etching openings 30 in the low-k dielectric layer 14. As shown in FIG. 3B, a protective coating 26 of silicon-containing material or metallic material is sputtered from the upper electrode onto the sidewalls 32 of the low-k dielectric layer 14. As shown, the sputtered silicon-containing or metallic material may also deposit on the upper surface of imaging layer 20 and on sidewalls of the intermediate layer 18 and the bottom layer 16. After the protective coating 26 is formed, the multi-layer resist is then stripped from the semiconductor substrate 10, preferably using an oxygen plasma, to result in the structure shown in FIG. 4A. During the resist stripping process, the protective coating 26 advantageously reduces, and preferably minimizes etching of and resulting damage to, the sidewalls 32 of the low-k dielectric layer 14. The resist stripping process can be performed in the plasma processing chamber 102. Alternatively, the semiconductor substrate 10 can be removed from the plasma processing chamber 102 and the resist stripping process can be performed in a different plasma processing chamber, such as a dedicated stripping chamber.

Figure 4A:
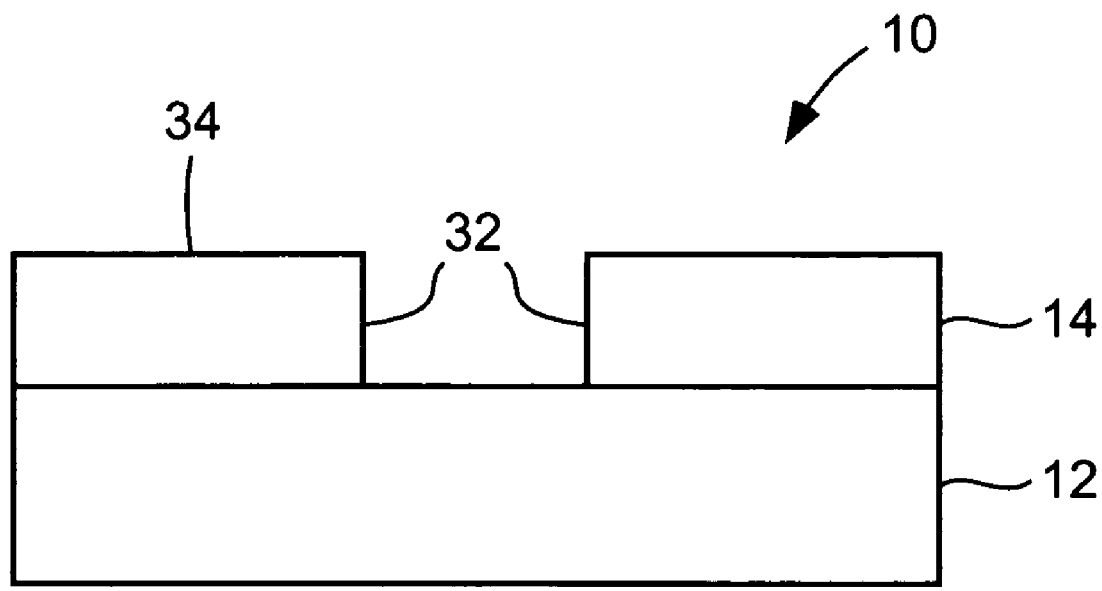
FIGS. 4A-4B illustrate a third embodiment of a method of depositing a protective coating on a low-k dielectric layer of a semiconductor substrate after stripping of an overlying mask.
Figure 4B:
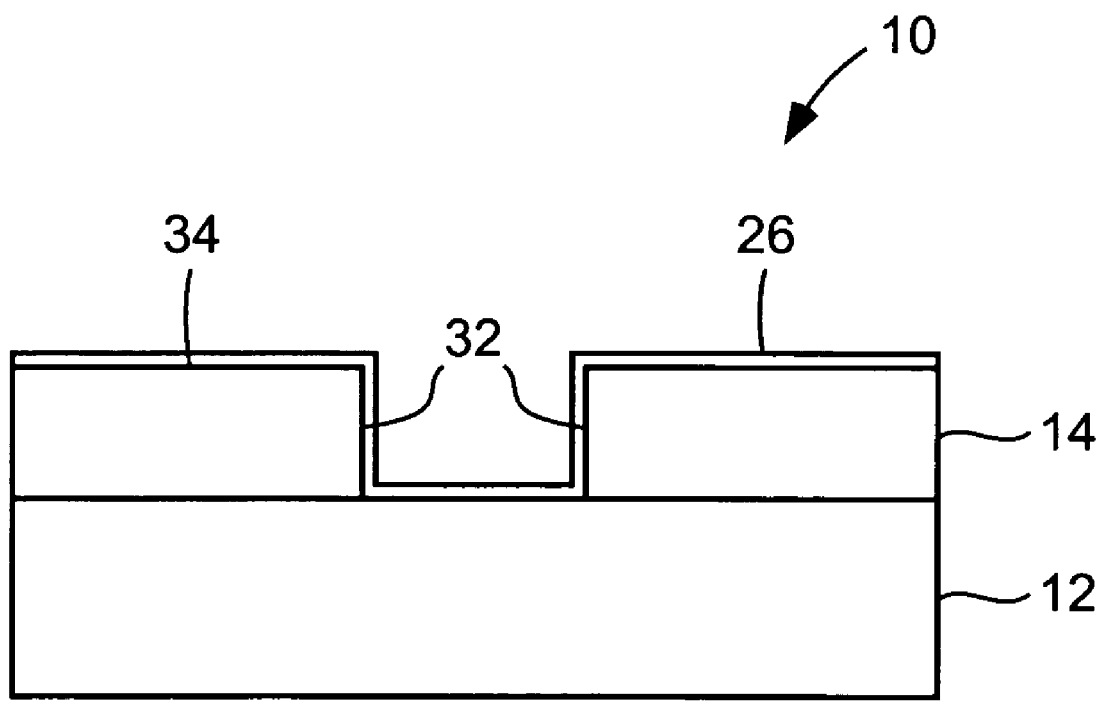

A process according to a third preferred embodiment is illustrated in FIGS. 4A and 4B. As shown in FIG. 4B, a protective coating 26 of silicon-containing material or metallic material is deposited on the upper surface 34 and sidewalls 32 of the low-k dielectric layer 14 after stripping the multi-layer mask from the semiconductor substrate 10. The protective coating 26 reduces, and preferably minimizes, moisture absorption by the low-k dielectric layer 14.

As mentioned above, a dual damascene process according to a preferred embodiment can include any one or two, or all three, of the above-described methods depicted in FIGS. 2A-2C, 3A-3B and 4A-4B. In a preferred embodiment, the dual damascene process includes each of these preferred embodiments to protect both the photoresist and low-k dielectric material during plasma processing.

In addition to providing a protective coating of silicon-containing material or metallic material on surfaces of semiconductor substrates, according to another preferred embodiment, top feed or bottom feed power and frequency conditions can be used in a capacitively-coupled plasma processing chamber, such as the plasma processing chamber 102 shown in FIG. 1, to sputter material from an upper electrode to thereby clean the electrode and provide for stable etch processing. The cleaning gas used to generate plasma for cleaning the upper electrode can be the same gas mixture, or a different gas mixture, than the gas mixture used to generate plasma for sputtering material from the electrode to produce a protective coating on a semiconductor substrate. In such embodiments, the upper electrode can be cleaned prior to depositing the protective coating on a semiconductor substrate in the processing chamber. The cleaning process can be performed with or without a semiconductor substrate being present in the plasma processing chamber.

The foregoing has described the principles, preferred embodiments and modes of operation. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of depositing a protective coating of a silicon-containing material on a semiconductor substrate in a dual damascene process, the method comprising:
   providing a semiconductor substrate in a capacitively-coupled plasma processing chamber including a first electrode of a silicon-containing material and a second electrode, the semiconductor substrate comprising a low-k dielectric layer and a multi-layer mask including a patterned top imaging layer over the low-k dielectric layer, the semiconductor substrate being supported on the second electrode and the first electrode comprising a showerhead electrode;
   supplying a first process gas through the first electrode into a gap between the first and second electrodes of the plasma processing chamber; and
   energizing the first process gas into the plasma state and sputtering the silicon-containing material from the first electrode and forming a protective coating of the sputtered material on the imaging layer, without substantially etching the semiconductor substrate.

2. The method of claim 1, wherein the silicon-containing material is doped silicon, un-doped silicon or silicon carbide.

3. The method of claim 1, wherein the first process gas is energized into the plasma state by either:
   (i) grounding the first electrode and applying up to about 1000 W power to the second electrode at two different frequencies including a first frequency of less than about 10 MHz and a second frequency of more than about 12 MHz; or
   (ii) applying at least about 100 W power to the first electrode at a first frequency and applying power to the second electrode at a second frequency.

4. The method of claim 3, wherein:
   the first electrode is an upper electrode having a bottom surface facing an upper surface of the semiconductor substrate when the semiconductor substrate is supported in the plasma processing chamber, and the second electrode is an electrostatic chuck on which the semiconductor substrate is supported;

for (i), a ratio of the area of a first electrical ground surface of the plasma processing chamber to the area of the upper surface of the semiconductor substrate is less than about 5; and for (ii), a ratio of the area of a second electrical ground surface of the plasma processing chamber to the area of the bottom surface of the first electrode is less than about 5.

5. The method of claim 1, wherein:
the first process gas comprises $H_2$ and inert gas;
the $H_2$ is supplied into the plasma processing chamber at a lower flow rate than the inert gas; and
the plasma processing chamber is at a pressure of about 10 mTorr to about 300 mTorr.

6. The method of claim 1, wherein the imaging layer is composed of a photoresist material having a 193 nm exposure wavelength, and the mask comprises a bottom layer composed of a material having a 248 nm or 365 nm exposure wavelength on the low-k dielectric layer, and an intermediate layer of an antireflective coating material between the bottom layer and the imaging layer.

7. The method of claim 1, further comprising, after forming the protective coating on the imaging layer:
supplying a second process gas into the plasma processing chamber; and
energizing the second process gas into the plasma state and etching openings through the mask,
wherein the protective coating increases the etching selectivity of the imaging layer with respect to at least one layer of the mask which underlies the imaging layer.

8. The method of claim 1, further comprising, prior to providing or after providing, the semiconductor substrate in the plasma processing chamber:
supplying a cleaning gas into the plasma processing chamber; and
energizing the cleaning gas into the plasma state and sputtering contaminants from the first electrode.

9. A method of depositing a protective coating of a silicon-containing material on a semiconductor substrate in a dual damascene process, the method comprising:
providing a semiconductor substrate in a capacitively-coupled plasma processing chamber including a first electrode of a silicon-containing material and a second electrode, the semiconductor substrate comprising a patterned low-k dielectric layer and a patterned multi-layer mask over the low-k dielectric layer, the semiconductor substrate being supported on the second electrode and the first electrode comprising a showerhead electrode;
supplying a first process gas through the first electrode into a gap between the first and second electrodes of the plasma processing chamber; and
energizing the first process gas into the plasma state and sputtering the silicon-containing material from the first electrode and forming a protective coating of the sputtered material on sidewalls of features in the low-k dielectric layer, without substantially etching the semiconductor substrate.

10. The method of claim 9, wherein the silicon-containing material is un-doped silicon, doped silicon or silicon carbide.

11. The method of claim 9, wherein the first process gas is energized into the plasma state by either:
(i) grounding the first electrode and applying up to about 1000 W power to the second electrode at two different frequencies including a first frequency of less than about 10 MHz and a second frequency of more than about 12 MHz; or (ii) applying at least about 100 W power to the first electrode at a first frequency and applying power to the second electrode at a second frequency.

12. The method of claim 11, wherein:
the first electrode is an upper electrode having a bottom surface facing an upper surface of the semiconductor substrate when the semiconductor substrate is supported in the plasma processing chamber, and the second electrode is an electrostatic chuck on which the semiconductor substrate is supported;
for (i), a ratio of the area of a first electrical ground surface of the plasma processing chamber to the area of the upper surface of the semiconductor substrate is less than about 5; and
for (ii), a ratio of the area of a second electrical ground of the plasma processing chamber to the area of the bottom surface of the first electrode is less than about 5.

13. The method of claim 9, wherein:
the first process gas comprises $H_2$ and inert gas;
$H_2$ is supplied into the plasma processing chamber at a lower flow rate than the inert gas; and
the plasma processing chamber is at a pressure of about 10 mTorr to about 300 mTorr.

14. The method of claim 9, further comprising, after forming the protective coating on the low-k material:
supplying a second process gas into the plasma processing chamber or into a different plasma processing chamber; and
energizing the second process gas into the plasma state and stripping the multi-layer mask from the semiconductor substrate,
wherein the low-k dielectric material contains carbon and the protective coating reduces carbon depletion of the low-k dielectric layer during the stripping of the multi-layer mask from the semiconductor substrate.

15. The method of claim 14, wherein the second process gas contains oxygen and the silicon-containing material is deposited on the semiconductor substrate and converted to silicon oxide during stripping of the mask.

16. The method of claim 9, further comprising, prior to providing or after providing, the semiconductor substrate in the plasma processing chamber;
supplying a cleaning gas into the plasma processing chamber; and
energizing the cleaning gas into the plasma state and sputtering contaminants from the first electrode.

17. A method of depositing a protective coating of a silicon-containing material on a semiconductor substrate in a dual damascene process, the method comprising:
providing a semiconductor substrate in a capacitively-coupled plasma processing chamber including a first electrode of a silicon-containing material and a second electrode, the semiconductor substrate comprising a patterned low-k dielectric layer, the semiconductor substrate being supported on the second electrode and the first electrode comprising a showerhead electrode;
supplying a process gas through the first electrode into a gap between the first and second electrodes of the plasma processing chamber; and
energizing the process gas into the plasma state and sputtering the silicon-containing material from the first electrode and forming a protective coating of the sputtered material on the low-k dielectric layer, without substantially etching the semiconductor substrate.

18. The method of claim 17, wherein the silicon-containing material is un-doped silicon, doped silicon or silicon carbide.

19. The method of claim 17, wherein the process gas is energized into the plasma state by either:
  (i) grounding the first electrode and applying up to about 1000 W power to the second electrode at two different frequencies including a first frequency of less than about 10 MHz and a second frequency of more than about 12 MHz; or
  (ii) applying at least about 100 W power to the first electrode at a first frequency and applying power to the second electrode at a second frequency.

20. The method of claim 19, wherein:
  the first electrode is an upper electrode having a bottom surface facing an upper surface of the semiconductor substrate when the semiconductor substrate is supported in the plasma processing chamber, and the second electrode is an electrostatic chuck on which the semiconductor substrate is supported;
  for (i), a ratio of the area of a first electrical ground surface of the plasma processing chamber to the area of the upper surface of the semiconductor substrate is less than about 5; and
  for (ii), a ratio of the area of a second electrical ground surface of the plasma processing chamber to the area of the bottom surface of the first electrode is less than about 5.

21. The method of claim 17, wherein:
  the process gas comprises $H_2$ and inert gas;
  the $H_2$ is supplied into the plasma processing chamber at a lower flow rate than the inert gas; and
  the plasma processing chamber is at a pressure of about 10 mTorr to about 300 mTorr.

22. The method of claim 17, further comprising, prior to providing or after providing, the semiconductor substrate in the plasma processing chamber:
  supplying a cleaning gas into the plasma processing chamber; and
  energizing the cleaning gas into the plasma state and sputtering contaminants from, and thereby cleaning, the first electrode.

23. A method of depositing a protective coating of a silicon-containing material on a semiconductor substrate in a dual damascene process, the method comprising:
  providing a semiconductor substrate in a capacitively-coupled plasma processing chamber including a first electrode of a silicon-containing material and a second electrode, the semiconductor substrate comprising a low-k dielectric layer and an optional multi-layer mask including a patterned top imaging layer over the low-k dielectric layer, the semiconductor substrate being supported on the second electrode and the first electrode comprising a showerhead electrode;
  supplying a process gas through the first electrode into a gap between the first and second electrodes of the plasma processing chamber; and energizing the process gas into the plasma state and sputtering the silicon-containing material from the first electrode and forming a protective coating of the sputtered material (i) on sidewalls of features in the low-k dielectric layer or (ii) on the optional imaging layer, without substantially etching the semiconductor substrate.

24. The method of claim 23, wherein the protective coating is formed on the imaging layer.

25. The method of claim 23, wherein the protective coating is formed on the sidewalls of the features of the low-k material.

26. The method of claim 23, wherein the semiconductor substrate does not include the multi-layer mask and the protective coating is formed on the low-k material.

27. The method of claim 23, wherein the process gas is energized into the plasma state by:
  (i) grounding the first electrode and applying up to about 1000 W power to the second electrode at two different frequencies including a first frequency of less than about 10 MHz and a second frequency of more than about 12 MHz; or
  (ii) applying at least about 100 W power to the first electrode at a first frequency and applying power to the second electrode at a second frequency which is different from the first frequency.

28. The method of claim 27, wherein:
  the first electrode is an upper electrode having a bottom surface facing an upper surface of the semiconductor substrate when the semiconductor substrate is supported in the plasma processing chamber, and the second electrode is an electrostatic chuck on which the semiconductor substrate is supported;
  for (i), a ratio of the area of a first electrical ground of the plasma processing chamber to the area of the upper surface of the semiconductor substrate is less than about 5; and
  for (ii), a ratio of the area of a second electrical ground of the plasma processing chamber to the area of the bottom surface of the first electrode is less than about 5.

29. The method of claim 23, further comprising, prior to providing or after providing, the semiconductor substrate in the plasma processing chamber:
  supplying a cleaning gas into the plasma processing chamber; and
  energizing the cleaning gas into the plasma state and sputtering contaminants from the first electrode.

* * * * *